United States Patent [19]

Slavin

[11] Patent Number: 5,561,616

[45] Date of Patent: Oct. 1, 1996

[54] FIR FILTER BASED UPON SQUARING

[75] Inventor: Keith R. Slavin, Aloha, Oreg.

[73] Assignee: Tektronix, Inc., Wilsonville, Oreg.

[21] Appl. No.: 929,039

[22] Filed: Aug. 13, 1992

[51] Int. Cl.[6] .................................................. G06F 17/10
[52] U.S. Cl. .................... 364/724.01; 364/724.16
[58] Field of Search ..................... 364/724.01, 724.16, 364/724.17, 750.5, 724.03

[56] References Cited

U.S. PATENT DOCUMENTS 4,817,025  3/1989  Asai et al. ......................... 364/724.16
5,031,133  7/1991  Sasaki ................................ 364/724.16
5,204,827  4/1993  Fujita et al. ..................... 364/724.16 X Primary Examiner—Roy N. Envall, Jr.
Assistant Examiner—Chuong D. Ngo
Attorney, Agent, or Firm—Francis I. Gray

[57] ABSTRACT

A FIR filter based upon squaring accumulates the sum of the squares of the samples of a digital input signal. The samples also are added to respective filter coefficients, squared and accumulated in a plurality of filter stages. The sum of the squares of the samples are subtracted, together with a constant that is the sum of the squares of the filter coefficients, from the output of the last filter stage to produce an output signal that is divided by two to produce the samples for a digital output signal.

17 Claims, 2 Drawing Sheets

FIR FILTER BASED UPON SQUARING

BACKGROUND OF THE INVENTION

The present invention relates to digital filtering of electronic signals, and more particularly to a Finite Impulse Response (FIR) filter based upon squaring.

The standard FIR filter convolution satisfies the following equation:

$$z(t)=\text{SUM}\{y(t-i)*C(T-1-i), (i,0,T-1)\}$$

where $z(t)$ is the filtered output at time t, C is a filter coefficient for each of T stages, $y(t)$ is the input at time t, and SUM is the sum of the products of $y(t)$ and C for the range of i between 0 and T–1. In such a FIR filter configuration the complexity in gate count, G(M,N), is proportional to the number of cross-terms between multiplicands, and is approximately given by:

$$G(M,N)=11M*N-10N-5M \quad (N>=1, M>=2)$$

for an M+N bit result of a multiply. The number of gates determines the amount of silicon area required in an integrated circuit in order to implement the FIR filter.

What is desired is a simpler configuration for a FIR filter that reduces the complexity, and thus the number of gates, in order to minimize the amount of silicon in an integrated circuit necessary to implement the filter.

SUMMARY OF THE INVENTION

Accordingly the present invention provides a FIR filter based upon squaring that reduces the number of gates required for implementation in an integrated circuit by almost a factor of two. The filter coefficients for each stage are added to the input signal, the sum is squared, and the results from each stage are accumulated. The sum of the squares of the input signal is subtracted from the output of the last filter stage. The sum of the squares of all of the filter coefficients also is subtracted, and the result is divided by two to produce the output signal. This structure may be implemented in hardware using either conventional binary or residue number system (RNS) arithmetic. Binary arithmetic is a special case of a single residue RNS where the modulus is $2^n$, n being the number of bits.

The objects, advantages and novel features of the present invention are apparent from the following detailed description when read in view of the appended claims and attached drawing.

DESCRIPTION OF THE PREFERRED EMBODIMENT

Figure 1:
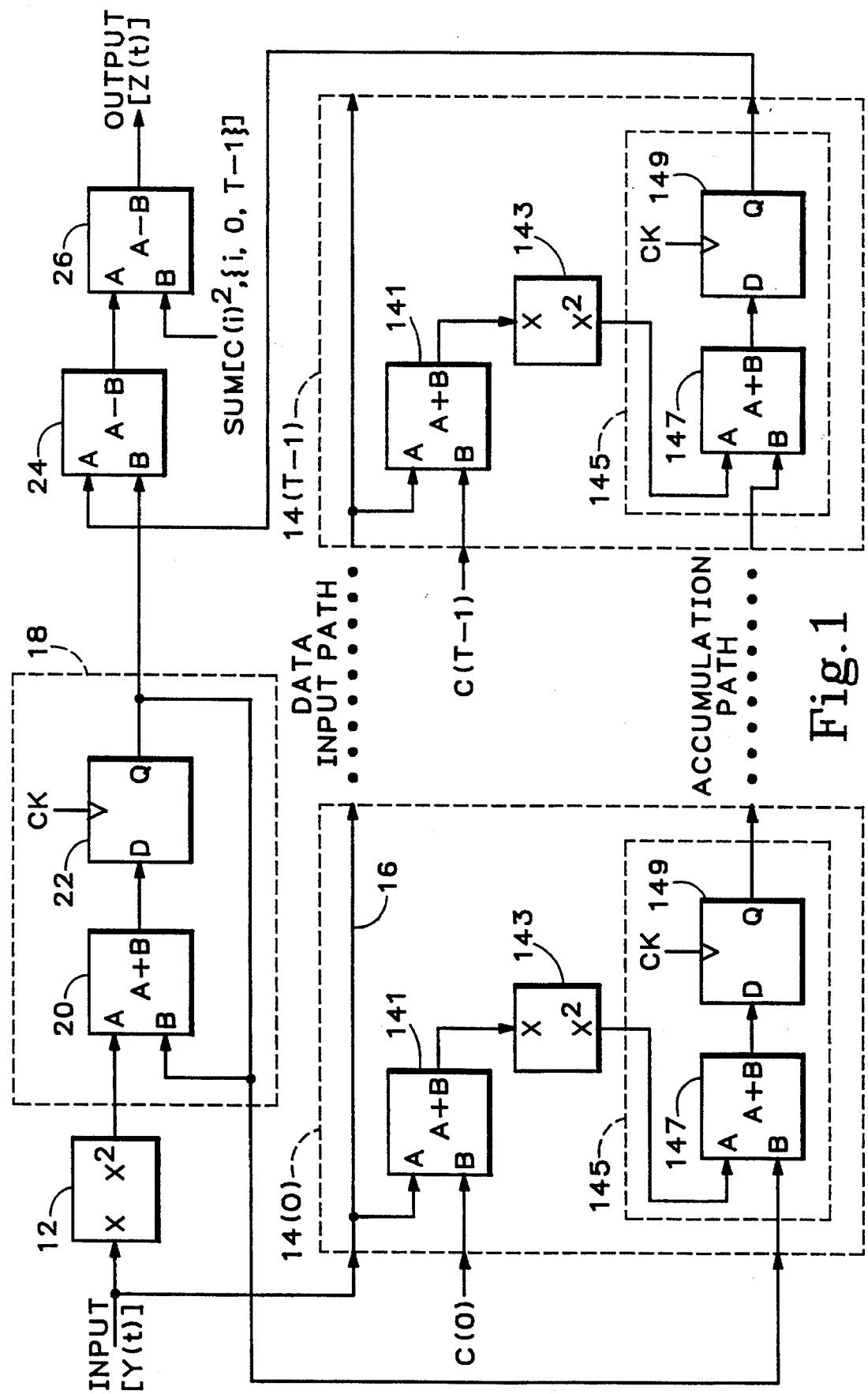
FIG. 1 is a block diagram for a FIR filter based upon squaring according to the present invention.

Referring now to FIG. 1 an input signal $y(t)$ is applied to a squaring circuit 12 and to a plurality T of filter stages 14. A separate filter coefficient C is applied to each filter stage 14. Each filter stage 14 has an input summing circuit 141 to which the input signal $y(t)$ is coupled. The appropriate coefficient C is applied as a second input for adding to the input signal. The output of the input summing circuit 141 is input to a squaring circuit 143 to produce the square of the sum of the input signal and its coefficient. The output of the squaring circuit 143 is input to an accumulator 145 that includes a second summing circuit 147 in series with an accumulator register 149 that is clocked by a system clock CK. The accumulators 145 of the stages are coupled in series so that one input is the output of the stage squaring circuit 143 and the other input is the output from a preceding stage accumulator except for the first stage 14(0).

The squared input signal from the initial squaring circuit 12 is input to an input accumulator 18 that includes a summing circuit 20 and a register 22 clocked by the system clock CK. The output of the accumulator 18 is applied as another input to the accumulator so that the output of the accumulator is the sum of the squares of the input signal. The output of the accumulator 18 also is input as the other input to the accumulator 145 of the first stage 14(0). Finally the output of the accumulator 18 is input to a subtracting circuit 24 together with the output of the accumulator 145 from the last filter stage 14(T–1). This difference is input to an output subtracting circuit 26 to which also is input the sum of the squares of all of the coefficients C. The difference produced by the output subtracting circuit 26 is twice the filtered output signal $z(t)$. Discarding the least significant bit of the output in the output subtracting circuit 26 produces the filtered digital output signal.

The gate count required to implement this configuration is approximately one-half that for the conventional design since in squaring the cross-terms are duplicated. Thus for an N-bit squarer (2N bit result) the gate count G(N) is:

$$G(N)=11*N^2/2-31*N/2-5 \quad (N>3)$$

which is very close to one-half of G(M,N) if M and N are large and approximately equal. The invention uses the identity:

$$y(i)*C(j)=\{(y(i)+C(j))^2-y(i)^2-C(j)^2\}/2$$

and proceeds to find the sum of $(y(i)+C(j))^2$ rather than the sum of $(y(i)*C(j))$ using a method of finding the sum of $y^2$ that uses minimal additional hardware. The sum of $C(j)^2$ may be found in a non-real-time manner, also with minimal hardware, or even by pre-calculation and external entry with each new set of coefficients as they are loaded.

The conventional T-tap FIR convolution expression is:

$$z(t)=\text{SUM}[y(t-i)*C(i), (i,0,T-1)].$$

For a T-tap FIR filter design based on squaring there is a set of T+1 storage elements $S(n,t)$ for n=0 to T. In hardware these storage elements and coefficients are connected according to the relations:

$$z(t)=[S(T,t)-S(0,t)-K]/2 \quad (1)$$

where K is a constant for fixed coefficients given by:

$$K=\text{SUM}[C(i)^2, (i,0,T-1)] \quad (2)$$

and the two recursions are:

$$S(n,t)=S(n-1,t-1)+[y(t)+C(T-n)]^2 \quad (n>0) \quad (3)$$

and $$S(n,t)=S(n,t-1)+y(t)^2 \quad (n=0) \quad (4)$$

where $y(t)$ is the input to the filter at time t. Taking n=0 and applying equation (4) for r iterations gives:

$$S(0,t) = S(0,t-r) + SUM[y(t-\hat{i})^2, (i,0,r-1)] \quad (5)$$

which, with t–j replacing t and m–j replacing r, gives:

$$\begin{aligned}
S(0,t-j) &= S(0,t-m) + SUM[y(t-j-\hat{i})^2, (i,0,m-j-1)] \\
&= S(0,t-m) + SUM[y(t-\hat{i})^2, (i,j,m-1)]
\end{aligned} \quad (6)$$

which is the sum of squares of the last m–j input samples plus an arbitrary constant S(0,t–m). Using the recursion of equation (3) T times, starting with n=T, gives:

$$S(T,t) = S(0,t-T) + SUM[(y(t-1)+C(i))^2, (i,0,T-1)] \quad (7).$$

Expanding the square and substituting equation (6) with j=T for S(0,t–T) gives:

$$\begin{aligned}
S(T,t) = \; & S(0,t-m) + \\
& SUM[y(t-\hat{i})^2, (i,T,m-1)] + \\
& SUM[y(t-\hat{i})^2, (i,0,T-1)] + \\
& 2*SUM[y(t-\hat{i})*C(i), (i,0,T-1)] + \\
& SUM[C(i)^2, (i,0,T-1)].
\end{aligned} \quad (8)$$

Combining the sums in $y(t-i)^2$ in equation (8) gives:

$$\begin{aligned}
S(T,t) = \; & S(0,t-m) + \\
& SUM[y(t-\hat{i})^2, (i,0,m-1)] + \\
& 2*SUM[y(t-\hat{i})*C(i), (i,0,T-1)] + \\
& SUM[C(i)^2, (i,0,T-1)].
\end{aligned} \quad (9)$$

Substituting for S(T,t) from equation (9) and S(0,t) from equation (6) into equation (1) with j=0 and with K from equation (2) gives:

$$\begin{aligned}
z(t) = \; & \{(S(0,t-m) + \\
& SUM[y(t-\hat{i})^2, (i,0,m-1)] + \\
& 2*SUM[y(t-\hat{i})*C(i), (i,0,T-1)] + \\
& SUM[C(i)^2, (i,0,T-1)]) - \\
& (S(0,t-m) + \\
& SUM[y(t-\hat{i})^2, (i,0,m-1)]) - \\
& (SUM[C(i)^2, (i,0,T-1)])\}/2 \\
= \; & SUM[y(t-\hat{i})*C(i), (i,0,T-1)]
\end{aligned}$$

which is the conventional T-tap FIR convolution expression. This result also shows that the initial state of storage element S(0,t–m) in equation (6) does not affect the result, so the accumulation iteration in equation (4) does not have to be cleared at power-up.

Equation (4) implies that for non-zero inputs overflows in S(0,t) are bound to occur eventually. It is therefore important that the system has a linear overflow property, i.e., that an overflow, or underflow, from addition at some stage in the calculation can be restored to the correct value by a later subtraction (see equation (1)) of the same magnitude.

Residue Number Systems (RNS) automatically fulfill this requirement because overflows are inherently linear. Squarers also are very small for small moduli, leading to economical hardware implementation and potentially very high operating speeds. The dynamic range R is given by the product of all of the moduli in the system. FIR filters based on squaring techniques may be implemented with conventional arithmetic structures if one regards this as a special case of an RNS with just a single modulus. The chosen moduli are usually of the form R=2^n where n is an integer, i.e., the number of bits. Other forms tend to be less efficient. Enough bits need to be maintained to handle the ladder accumulation on its own without overflow because no later subtraction restores the status quo. Therefore no overflows in either approach are assured if:

$$R >= SUM[ABS(C(i)), (i,0,T-1)]*Rin*2$$

where Rin is the dynamic input range allowed, i.e., R is the largest possible correlation between input data and the filter coefficients. ABS is a function that returns the absolute value of C(i).

Figure 2:
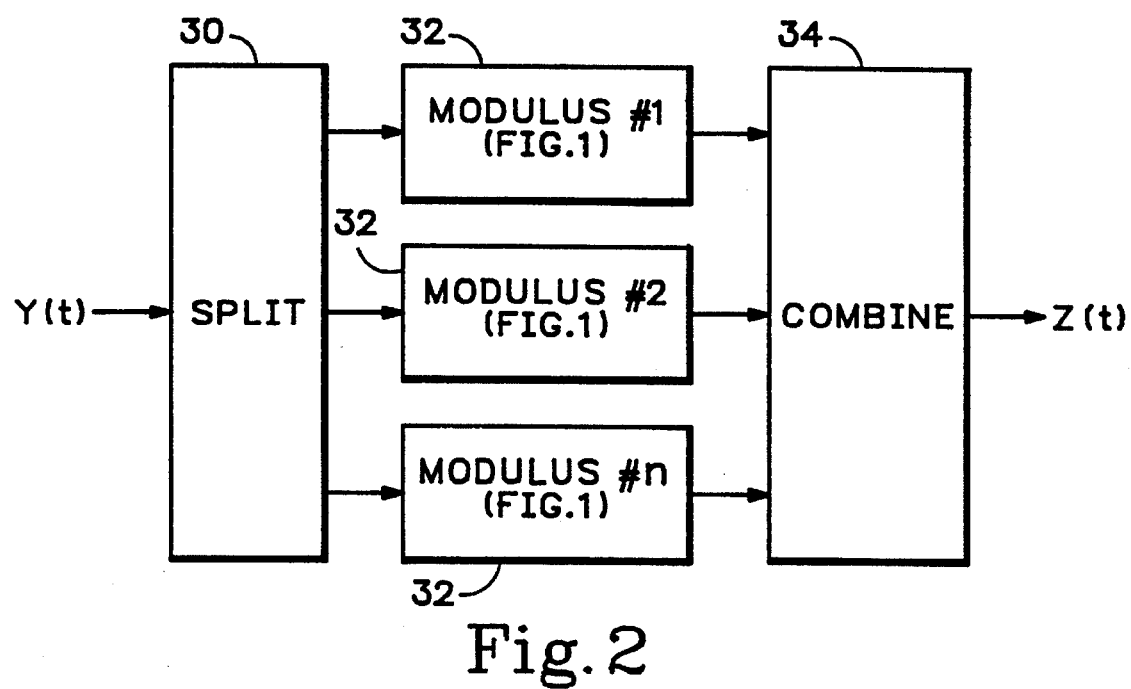
FIG. 2 is a generalized block diagram for a FIR filter based upon squaring using an RNS system implementation according to the present invention.

Implementing the squaring FIR filter in the RNS system is shown in FIG. 2. The digital input signal is input to an RNS splitter 30 to separate the digital input signal into its corresponding residue forms according to the selected moduli. Then each residue signal is processed independently in respective FIR filters 32 as described above with respect to FIG. 1. The results from the independent processing are input to an RNS combiner 34 to produce the digital output signal in binary form. A simple RNS system as an example is described below. For further details on RNS systems refer to the IEEE PRESS Reprint Series entitled "Residue Number System Arithmetic: Modern Applications in Digital Signal Processing" (1986).

A system where the binary values range between zero and fourteen requires four bits. Using moduli of three and five, two systems of two and three bits are required. The conversion between binary and residue values is illustrated in the following table:

TABLE I

| Binary Value | Mod 3 Value | Mod 5 Value |
|---|---|---|
| 0 | 0 | 0 |
| 1 | 1 | 1 |
| 2 | 2 | 2 |
| 3 | 0 | 3 |
| 4 | 1 | 4 |
| 5 | 2 | 0 |
| 6 | 0 | 1 |
| 7 | 1 | 2 |
| 8 | 2 | 3 |
| 9 | 0 | 4 |
| 10 | 1 | 0 |
| 11 | 2 | 1 |
| 12 | 0 | 2 |
| 13 | 1 | 3 |
| 14 | 2 | 4 |

Using modulus arithmetic the number of bits input to the squaring circuits equals the number of bits output from the squaring circuits. The range of binary values represented by this RNS system is the product of the two moduli, or fifteen. Using more moduli or larger moduli extends the range of values that can be processed.

Thus the present invention provides a FIR filter based on squaring that is fast and has reduced gate count to minimize the amount of silicon on an integrated circuit chip required for implemention.

What is claimed is:

1. An apparatus for filtering a digital input signal to produce a digital output signal comprising:

means for generating from the digital input signal a first intermediate signal that represents the sum of the squares of sample values for the digital input signal;

means for generating a second intermediate signal that is the sum of the squares of the sum of samples of the digital input signal and corresponding filter coefficient values plus the first intermediate signal; and means for generating the digital output signal from the first and second intermediate signals and a constant that is the sum of the squares of the filter coefficient values.

2. The apparatus of claim 1 wherein the first intermediate signal generating means comprises:

means for squaring the samples of the digital input signal; and means for accumulating the squared samples of the digital input signal to produce the first intermediate signal.

3. The apparatus of claim 1 wherein the second intermediate signal generating means comprises a plurality of filter stages, each filter stage having a first input to receive the digital input signal, a second input to receive a corresponding one of the filter coefficient values, and a third input to receive an output signal from a preceding one of the filter stages, the first of the filter stages receiving at the third input the first intermediate signal and the output signal from the last of the filter stages being the second intermediate signal.

4. The apparatus of claim 3 wherein each filter stage comprises:

means for summing the samples of the digital input signal at the first input with the corresponding filter coefficient at the second input;

means for squaring the output of the summing means; and means for accumulating the output of the squaring means with the signal at the third input.

5. The apparatus of claim 1 wherein the digital output signal generating means comprises:

means for subtracting the first intermediate signal from the second intermediate signal to produce a third intermediate signal; and means for combining the constant with the third intermediate signal to produce the digital output signal.

6. The apparatus of claim 5 wherein the combining means further comprises:

means for subtracting the constant from the third intermediate signal to produce a fourth intermediate signal; and means for dividing the fourth intermediate signal by two to produce the digital output signal.

7. A method of digitally filtering an electronic signal in the form of a digital input signal to produce a digital output signal representing a filtered version of the electronic signal comprising the steps of:

generating from the digital input signal a first intermediate signal that represents the sum of the squares of sample values for the digital input signal;

generating a second intermediate signal from a plurality of filter stages having the first intermediate signal as an input to the first filter stage, the second intermediate signal output from the last of the filter stages being the sum of the squares of the sum of samples of the digital input signal and corresponding filter coefficient values plus the first intermediate signal; and generating the digital output signal from the first and second intermediate signals and a constant that is the sum of the squares of the filter coefficient values.

8. The method of claim 7 wherein the first intermediate signal generating step comprises the steps of:

squaring the samples of the digital input signal; and accumulating the squared samples of the digital input signal to produce the first intermediate signal.

9. The method of claim 7 wherein the second intermediate signal generating step comprises the steps of:

inputting the samples of the digital input signal to the plurality of filter stages;

in each filter stage adding a corresponding one of the filter coefficient values to the digital input signal;

in each filter stage squaring the sum of the digital input signal and the filter coefficient value; and in each filter stage accumulating the output from the squaring step with an output signal from a preceding one of the filter stages, the output signal from the last of the filter stages being the second intermediate signal and the input to the first of the filter stages in lieu of the output from a preceding filter stage being the first intermediate signal.

10. The method of claim 7 wherein the digital output signal generating step comprises the steps of:

subtracting the first intermediate signal from the second intermediate signal to produce a third intermediate signal; and combining the constant with the third intermediate signal to produce the digital output signal.

11. The method of claim 10 wherein the combining step further comprises the steps of:

subtracting the constant from the third intermediate signal to produce a fourth intermediate signal; and dividing the fourth intermediate signal by two to produce the digital output signal.

12. An apparatus for filtering a digital input signal in binary form to produce a digital output signal in binary form comprising:

means for splitting the digital input signal into a plurality of digital residue signals according to a corresponding plurality of selected moduli;

means for filtering each digital residue signal to produce an output signal in residue form, each filtering means having:

means for generating from the digital residue signal a first intermediate signal that represents the sum of the squares of sample values for the digital residue signal, means for generating a second intermediate signal that is the sum of the squares of the sum of samples of the digital residue signal and corresponding filter coefficient values plus the first intermediate signal, and means for generating the output signal from the first and second intermediate signals and a constant that is the sum of the squares of the filter coefficient values; and means for combining the output signals from the filtering means to produce the digital output signal in binary form.

13. The apparatus of claim 12 wherein the first intermediate signal generating means comprises:

means for squaring the samples of the digital residue signal; and means for accumulating the squared samples of the digital residue signal to produce the first intermediate signal.

14. The apparatus of claim 12 wherein the second intermediate signal generating means comprises a plurality of filter stages, each filter stage having a first input to receive the digital residue signal, a second input to receive a corresponding one of the filter coefficient values, and a third input to receive an output signal from a preceding one of the filter stages, the output signal of the last of the filter stages being the second intermediate signal.

15. The apparatus of claim 14 wherein each filter stage comprises:

means for summing the samples of the digital residue signal at the first input with the corresponding filter coefficient value at the second input;

means for squaring the output of the summing means; and means for accumulating the output of the squaring means with the signal at the third input.

16. The apparatus of claim 12 wherein the digital output signal generating means comprises:

means for subtracting the first intermediate signal from the second intermediate signal to produce a third intermediate signal; and means for combining the constant from the third intermediate signal to produce the digital output signal.

17. The apparatus of claim 16 wherein the combining means further comprises:

means for subtracting the constant from the third intermediate signal to produce a fourth intermediate signal; and means for dividing the fourth intermediate signal by two to produce the output signal.

* * * * *